United States Patent [19]

Hartswick et al.

[11] Patent Number: 5,034,348
[45] Date of Patent: Jul. 23, 1991

[54] PROCESS FOR FORMING REFRACTORY METAL SILICIDE LAYERS OF DIFFERENT THICKNESSES IN AN INTEGRATED CIRCUIT

[75] Inventors: Thomas J. Hartswick, Underhill; Carter W. Kaanta, Colchester; Pei-Ing P. Lee; Terrance M. Wright, both of Williston, all of Vt.

[73] Assignee: International Business Machines Corp., Armonk, N.Y.

[21] Appl. No.: 567,992

[22] Filed: Aug. 16, 1990

[51] Int. Cl.⁵ .......................................... H01L 21/283
[52] U.S. Cl. .................................... 437/200; 437/192; 437/193; 437/41
[58] Field of Search ................. 437/200, 192, 193, 41

[56] References Cited

U.S. PATENT DOCUMENTS

| | | | |
|---|---|---|---|
| 4,128,670 | 12/1978 | Gaensslen | 427/86 |
| 4,587,718 | 5/1986 | Haken | 437/200 |
| 4,593,454 | 6/1986 | Baudrant et al. | 29/571 |
| 4,605,947 | 8/1986 | Price et al. | 357/23.15 |
| 4,619,038 | 10/1986 | Pintchovski | 437/200 |
| 4,640,004 | 2/1987 | Thomas et al. | 437/200 |
| 4,690,730 | 9/1987 | Tang et al. | 156/643 |
| 4,746,219 | 5/1988 | Holloway et al. | 357/23.11 |
| 4,824,521 | 4/1989 | Kulkarni | 156/643 |
| 4,910,122 | 3/1990 | Arnold et al. | 430/313 |

FOREIGN PATENT DOCUMENTS 62-104174  5/1987  Japan.
0012152  1/1988  Japan ................................. 437/200

OTHER PUBLICATIONS

"Formation of Titanium Nitride/Silicide Bilayers...", Morgan et al., in Rapid Thermal Processing, MRS 1986, pp. 279-287.
"Stable, Self-Aligned $TiN_xO_y/TiSi_2$ Contact Formation for Submicron Device Applications", Ku et al., Appl. Phy. Lett. 50(22), 6/87, pp. 1598-1600.
"Novel Submicron MOS Devices by Self-Aligned Nitridation of Silicide (Sanicide)", Kaneko et al., IEEE, IEDM Tech. Digest, 1985, pp. 208-211.
Wolf et al., "Silicon Processing for the VLSI Era", vol. 1, Jun., 1987, Lattice Press, pp. 384-406.

Primary Examiner—Brian E. Hearn
Assistant Examiner—T. N. Quach
Attorney, Agent, or Firm—Calfee, Halter & Griswold

[57] ABSTRACT

A method for forming reactive metal silicide layers at two spaced locations on a silicon substrate, which layers can be of different thicknesses and/or of different reactive metals is provided. A sililcon substrate has a silicon dioxide layer formed thereon followed by the formation of a polysilicon layer on the silicon dioxide layer, followed by forming a layer of refractory metal, e.g. titanium on the polysilicon. A non-reflecting material, e.g. titanium nitride is formed on the refractory metal. Conventional photoresist techniques are used to pattern the titanium nitride, the titanium and polysilicon, and the titanium is reacted with the contacted polysilicon to form a titanium silicide. The portion of silicon dioxide overlying the silicon substrate is then removed and the exposed substrate is ion implanted to form source/drain regions. A second layer of refractory metal, either titanium or some other refractory metal, is deposited over the source/drain region, and either over the titanium nitride, or over the first formed silicide by first removing the titanium nitride. The second layer of refractory metal is reacted with the substrate at the source/drain region to form a refractory metal silicide, after which the unreacted refractory metal is removed.

24 Claims, 3 Drawing Sheets

PROCESS FOR FORMING REFRACTORY METAL SILICIDE LAYERS OF DIFFERENT THICKNESSES IN AN INTEGRATED CIRCUIT

FIELD OF THE INVENTION

This invention relates generally to the fabrication of integrated circuits, and more specifically to a technique for providing refractory metal silicide layers of different materials or of differing thicknesses in a single MOS integrated circuit.

BACKGROUND OF THE INVENTION

The use of refractory metal silicides, and particularly titanium silicide, is becoming a widely accepted practice in very large scale integrated (VLSI) circuits since refractory metal silicides have better conductivity than silicon, thus making them desirable for gates and other interconnections as well as for source/drain regions of the devices.

In the formation of silicides in a single MOS VLSI integrated circuit, it is desirable that the gate electrodes be relatively thick to obtain the full benefit of the high conductivity of the silicide, whereas at the same time it is necessary that the thickness of the silicide in the source/drain regions be thin enough so as to not extend below the doped areas, i.e. not to "punch through" the doped areas which increases the possibility of excessive current leakage. Further, it may be desirable in some cases to have a different metal silicide at the gates than at the source/drain regions. Thus, it is desirable to provide a process which forms the relatively thick high conductivity silicide or similar high conductivity material on the gate electrodes while limiting the thickness of the silicide in the source/drain region so that it does not "punch through" the doped area and also provide for different silicides at different locations.

One approach to providing such differing thicknesses is shown and described in U.S. Pat. No. 4,587,718 assigned to Texas Instruments, Incorporated. This patent, while recognizing the problem, utilizes a technique that does not allow for close control of line width and also utilizes materials which are difficult to accurately and effectively remove during processing without adversely affecting the properties of the integrated circuit chip. Furthermore, these materials compromise in line circuit testing capability.

Other related references include U.S. Pat. No. 4,640,004 assigned to Fairchild Corporation; U.S. Pat. No. 4,746,219 assigned to Texas Instruments, Incorporated; U.S. Pat. No. 4,690,730 assigned to Texas Instruments, Incorporated; the Technical Articles, Morgan et al, *Formation of Titanium Nitride/Silicide Bilayers by Rapid Thermal Anneal In Nitrogen*, International Electron Devices Meeting, 1985, (Dec. 1-4, 1985) Pages 279 through 287; KU et al., *Stable Self-Aligned TiNxOy/TiSi2 Contact Formation For Submicron Device Applications*, Appl. Phys. Lett., Vol. 50, NO. 22 (June 1, 1987), pp. 1598–1600; Kaneko, H., et al., *Novel Submicron MOS Devices By Self-Aligned Nitridation of Silicide (Sanicide)*, IEDM 85 (1985), pp. 208-210; U.S. Pat. No. 4,619,038 assigned to Motorola; U.S. Pat. No. 4,593,454 assigned to Societe pour d'Etude et la Fabrication de Circuits Integres Speciaux EFCS; U.S. Pat. No. 4,605,947 assigned to Motorola; U.S. Pat. No. 4,128,670 assigned to IBM. Also see abstract of Japanese Publication Jap. No. 62-104174 (dated May 14, 1987 and assigned to Nippon Texas Instruments K.K.);

SUMMARY OF THE INVENTION

According to the present invention, a process for forming an integrated circuit having refractory metal silicide layers of different thicknesses or of different silicides in two spaced regions of the integrated circuit is provided. The process includes the steps of forming a layer of silicon dioxide on a silicon substrate wafer after which a layer of polysilicon is deposited on the layer of silicon dioxide. A layer of refractory metal is formed on the polysilicon and a layer of essentially non-reflecting material, preferably titanium nitride, is formed on the layer of refractory metal. The layers of polysilicon, refractory metal and non-reflecting material are patterned by techniques well known in the art. The integrated circuit is heated to react the refractory metal with the patterned layer of polysilicon to form a refractory metal silicide at those locations where the refractory metal and the polysilicon are in contact, preferably at this point in the processing, but it could be done at other points in the processing, e.g. before the patterning step. A layer of silicon dioxide is formed on the exposed surfaces of the substrate and the patterned layer of the polysilicon. Thereafter, a portion of the silicon dioxide is removed from the substrate and the patterned surface of the polysilicon by techniques well known in the art. Finally, a second refractory metal is formed on the substrate, and patterned polysilicon layer. The wafer is again heated to form metal silicide in the diffusion regions. Any unreacted metal is then removed from the wafers.

DESCRIPTION OF THE PREFERRED EMBODIMENT

Figure 1:
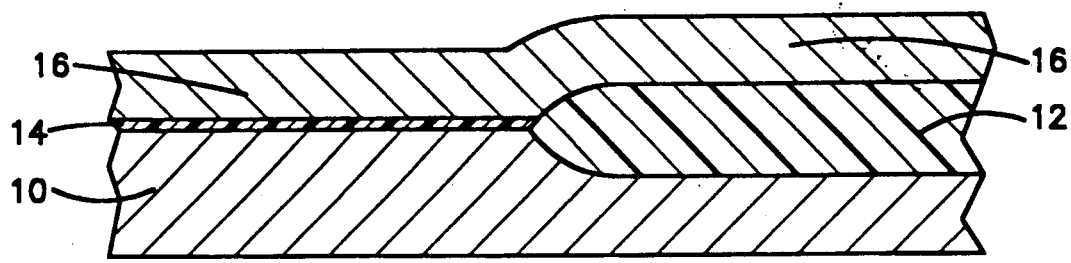
FIGS. 1 through 9 depict, schematically, various steps in the forming of an integrated circuit having various thicknesses of refractory metal silicides at different locations.

Referring now to FIG. 1, a silicon crystal substrate 10 is shown. The substrate 10 has an area of recessed oxide (ROX) 12 grown thereon in a conventional manner. A thin layer of silicon dioxide (e.g. less than few hundred angstroms thick) 14 is formed over the substrate 10. The silicon dioxide layer 14 can be thermally grown at about 900° C. or it can be deposited. Silicon oxynitride as well as other dielectric materials could also be used rather than silicon dioxide. The silicon dioxide or oxynitride layer is used as a gate dielectric.

Over the layer of silicon dioxide 14 and the recessed oxide 12 is formed a layer of polysilicon 16. The polysilicon 16 is typically deposited to a thickness of several thousand angstroms by low pressure chemical vapor deposition (LPCVD) which is done at about 700° C. for a time sufficient to produce the desired thickness, typically about 2000–6000 Angstroms. These processes to this point are conventional and well known in the art.

Figure 2:
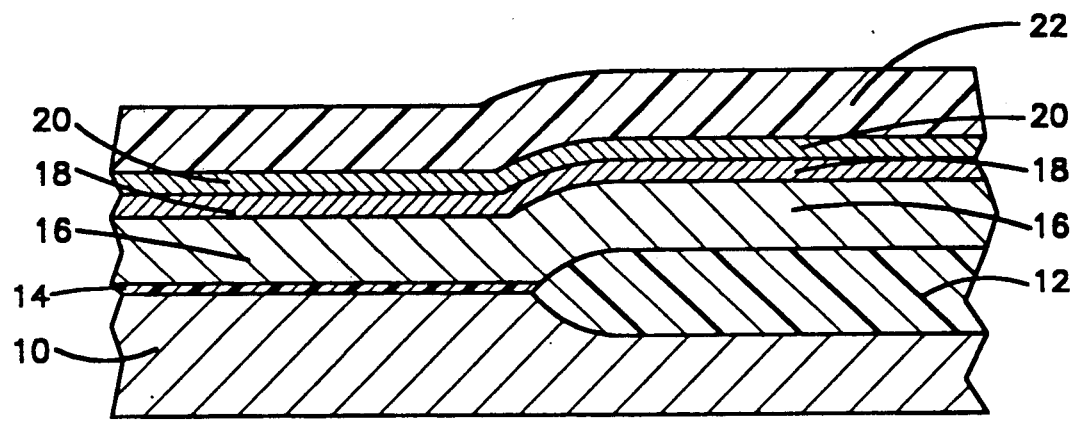

Referring now to FIG. 2, a layer of refractory metal 18 which will form a silicide with the polysilicon, preferably titanium is deposited over the layer of polysilicon 16. This layer of titanium is deposited in sufficient thickness to react with the underlying polysilicon layer which eventually will form the gate electrode. Typically, the titanium thickness will be about 200-1500 Angstroms. If the refractory metal is titanium, it can be deposited by either magnetron sputtering or evaporation techniques. When sputtering is used, it is deposited according to the following process. The titanium is sputtered in a single wafer system using 32 sccm of Ar. The chamber pressure is throttled to 4 mT of pressure. 3 Kw of power are applied to the target. The time is adjusted to give the desired or selected thickness.

Since titanium is a very reflective metal, and if photoresist were applied directly over the titanium, a problem would be encountered in providing uniform line width by photolithographic processes if there are irregularities or curves in the underlying surface as in the present instance. This is because the radiation used to expose the photoresist passes through the photoresist to the underlying material and if the underlying material is reflective, this radiation will be reflected; and if it is reflected at an angle, because of the irregularities or uneven surfaces, the line widths will be uneven due to unwanted or unintended exposure of the photoresist material due to reflected radiation at an angle. Therefore, non-reflecting or radiation absorbing material 20 is applied over the refractory metal 18. A preferred non-reflecting material is titanium nitride since this is compatible with the materials being used and is itself a conductive material and has many advantages. The titanium nitride can be deposited in situ in a magnetron sputtering system using known reactive sputtering techniques. However, other commercially available non-reflecting materials can be used rather than the titanium nitride.

Figure 3:
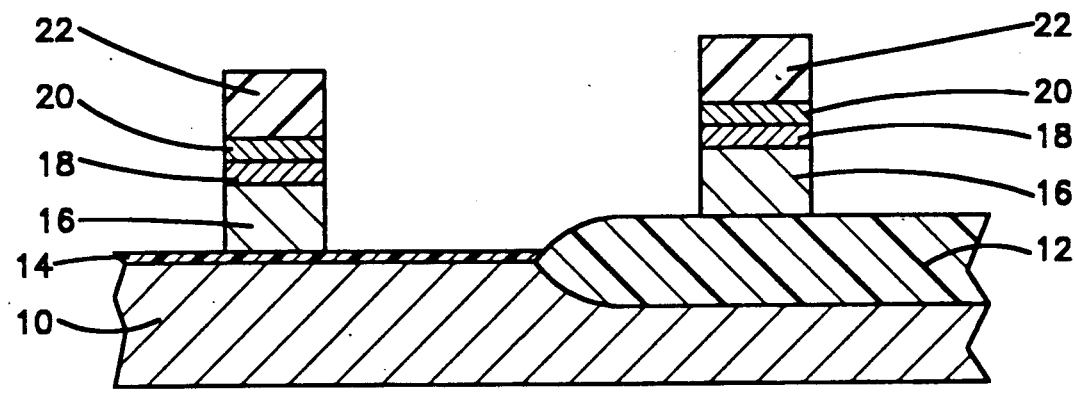

By well known conventional processes a layer of any suitable photoresist 22 is applied over the titanium nitride 20, which results in the structure shown in FIG. 2. The photoresist material is then imagewise exposed and developed according to conventional photolithographic practices. The exposed underlying layers of titanium nitride 20, titanium 18 and polysilicon 16 are reactive ion etched with the silicon dioxide layer 14 acting as an etch stop. A three minute step using 40 sccm of BCl$_3$ at 20 mT pressure starts the etch. DC bias is kept constant at 200 V. 750 Watts are used for the second step at 15 mT using 90 sccm HCl and 30 sccm of Cl. In the final step the gas pressure is throttled to 10 mT with the power supply set at a constant DC bias of $-215$ V. The gas mixture used for the final step is 10 sccm of O$_2$, 50 sccm of Ar and 50 sccm of HCl. This will result in the structure shown in FIG. 3.

Figure 4:
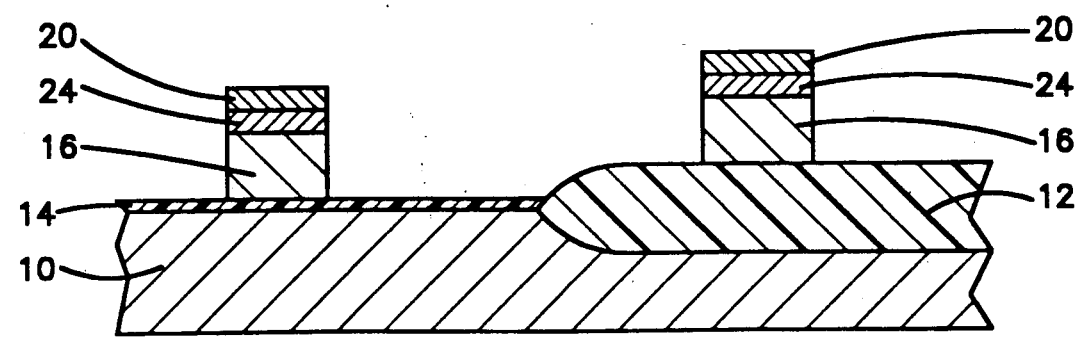

At this point, the remaining photoresist 22 is stripped by conventional techniques. In the preferred method, a "downstream" single wafer ash tool is used for stripping the photoresist. 5 l/min of O$_2$ flow into the chamber at 300 C. 550 Watts of power at 4.5 Torr create sufficient reactants to strip the resist in approximately 75 sec. The integrated circuit is heated to form refractory metal silicide at the interface between the refractory metal 18 and the polysilicon 16. In the embodiment where the refractory metal is titanium, the heating can take place at about 675° C. for sufficient time to form the silicide. This structure of resulting silicides is shown in FIG. 4 with the silicides being designated by the reference character 24. (The formation of the silicide is preferably done at this stage of the process, but it can be done later in the process if desired or earlier in the process even before the photoresist is applied).

Figure 5:
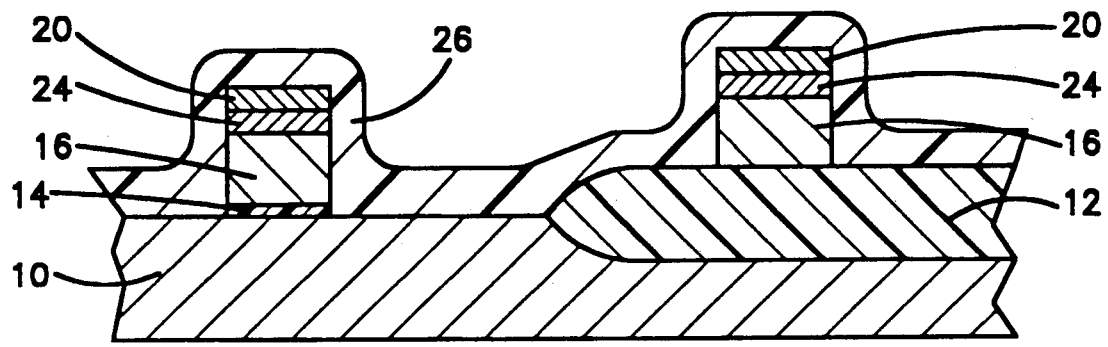

A layer of silicon dioxide 26 is then deposited over the entire substrate according to any conventional process. In the preferred process, a 240 nm thick coating of silicon dioxide is deposited using TEOS (Tetraethoxysilane) at 700° C. in a furnace using Nitrogen as the carrier gas. This results in the structure shown in FIG. 5. (Other dielectric materials such as silicon oxynitride can also be used).

Figure 6:
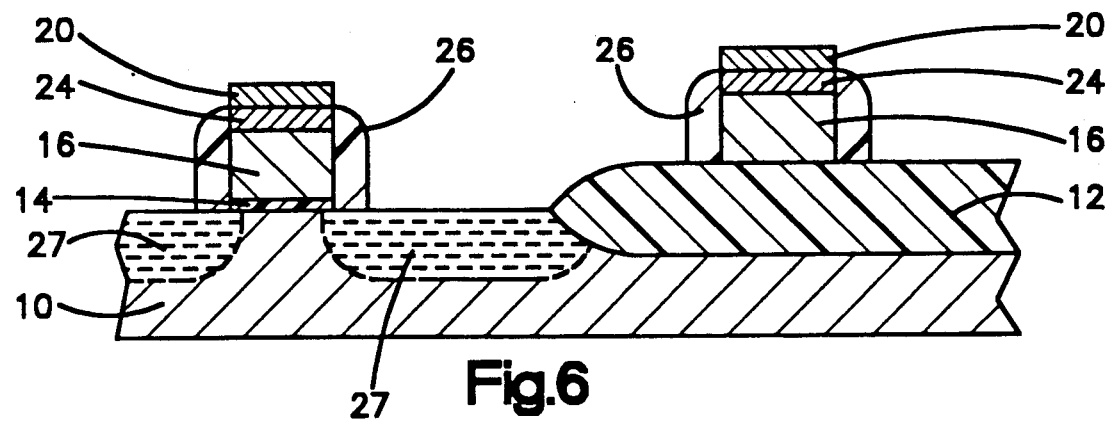

The silicon dioxide 26 is then reactive ion etched in a highly anisotropic etch to remove the oxide from the horizontal surface of the titanium nitride 20 and from the horizontal surface of the substrate wafer 10 but to leave the silicon dioxide as side walls around the silicide electrodes 24 as shown in FIG. 6. A batch tool preferably is used for this etch. 130 sccm of CHF$_3$ along with 115 sccm of O$_2$ flow into a chamber throttled to 35 mT. 1200 Watts are applied for approximately 7 minutes. It will be noted that there is some degree of "over-etch" of the side walls.

Ion implantation to create source and drain regions 27 is accomplished at this point by techniques well known in the art. Silicon dioxide gate side wall "spacers" provide electrical isolation between the gate and source/drain regions. It is at this point in the processing that an additional silicide is formed over the source/drain regions 27 which formation is independent of the formation of the silicides 24 on the polysilicon which will become the gate electrodes. There are several different procedures that can be followed in forming the silicide in the source/drain regions 27.

Figure 8:
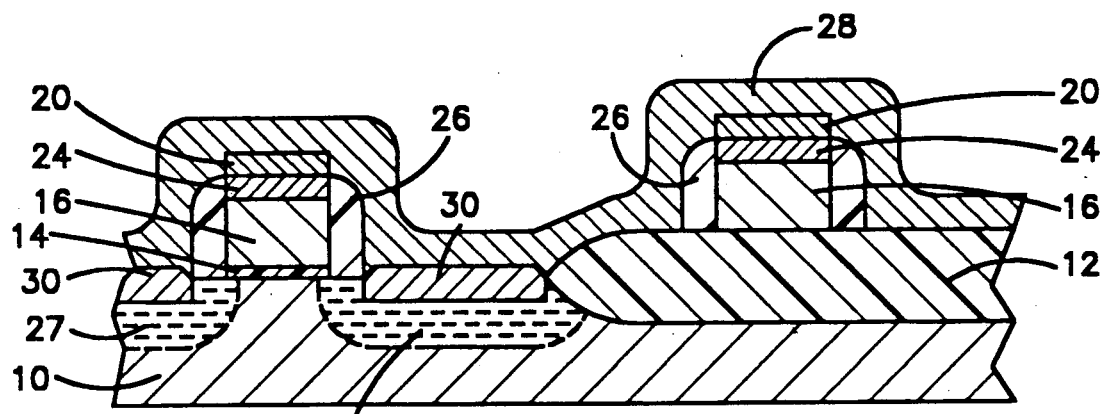

In one technique, the titanium nitride 20 is allowed to remain on top of the silicide electrodes 24 and a layer of refractory metal 28 is formed on the substrate 10 at the implanted or doped regions 27. This can be the same refractory material as was used to form the silicide 24 or it may be a different one; and, indeed one of the advantages of the present process is that different silicides can be formed at the source/drain regions 27 from those at the gate electrodes 24. For this embodiment, it will be described as depositing a layer of titanium 28 over the entire circuit, which is sputter deposited as previously described. The time is adjusted to give the desired or selected thickness. The amount of titanium 28 deposited is selected such that upon the subsequent heating step, the titanium 28 reacts with the silicon in the diffusion zone 27. The titanium silicide 30 which is formed is sufficiently thin so that it does not "punch through" the diffusion zone 27 but is sufficiently thick to meet the junction resistance requirements. This structure is shown in FIG. 8.

Figure 9:
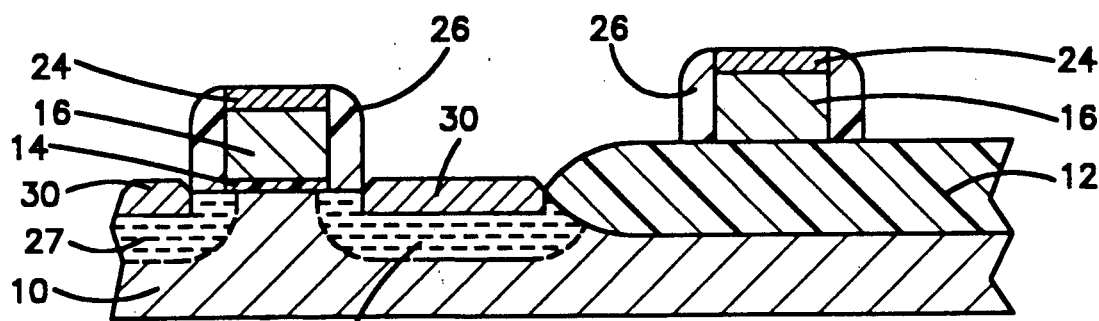

Also, during the heating, which is at about 675° C., the titanium 28 will react to some extent to form additional titanium nitride deposits. In this heating, the titanium 28 which is in contact with the recessed oxide 12 and in contact with the side wall oxide 26 will not form silicide and is thus essentially unreacted. This unreacted titanium and the titanium nitride are removed to form the structure shown in FIG. 9. This selective removal of the titanium and titanium nitride is accomplished by the following process. This is a wet etch for 15 minutes at 65° C. in a solution of 1 part H$_2$SO$_4$ and 10 parts H$_2$O$_2$ followed by 5 minutes at 65° C. in a solution of 5 parts reionized H$_2$O, 1 part NH$_4$OH and 1 part H$_2$O$_2$. This will remove the TiN without affecting the silicide.

As indicated above, one of the benefits of the present invention is the use of the non-reflective layer 20 over the highly reflective layer 18 to insure uniform line width during the patterning by the photoresist technique. Another advantage, as indicated earlier, is the ability to utilize different refractory metals to form silicides at the gate electrode regions on one hand and the source/drain regions on the other. For example, in the illustrated embodiment, the layer of refractory metal 18 can be chosen to be tungsten or molybdenum or cobalt and thus the silicide would be the corresponding silicide formed by a reaction with the polysilicon layer 16. The use of any of these refractory metals can be easily accomplished since with respect to any of the refractory metals on the gate electrodes, during the processing there does not have to be any selective removal of the unreacted refractory metal vis-a-vis the refractory metal silicide. Thus, a wide selection of refractory metals is available without having concern about selective removal of the unreacted refractory metal. If a different characteristic of silicide is desired for the source/drain region 27, then a different refractory metal such as titanium could be selected which provides the necessary titanium silicide and which can be easily selectively removed in the final step.

Another advantage of the present invention is the use of the preferred non-reflective material titanium nitride. If titanium nitride is selected as a non-reflective material, it being a very conductive material, the titanium nitride in many instances does not have to be removed prior to the step of forming the silicide at the source/drain region 27. However, if for some reason, one were to desire to remove the titanium nitride 20 after silicide formation, this can be very easily accomplished by the following process: a wet etch for 15 minutes at 65° C. in a solution of 1 part $H_2SO_4$ and 10 parts $H_2O_2$.

Other non-reflective materials also can be removed by conventional means if they are chosen instead of titanium nitride. For example, organic anti-reflective coating (ARC), such as that manufactured by Ciba-Geigy and others, may also be used for improved photolithographic control. However more complex processing is required to achieve the desired result. The ARC can be removed in much the same manner that photoresist is removed using an $O_2$ plasma as is well known in the art.

When the titanium nitride 20 (or other non-reflective material) has been removed, the processing can continue to form the silicide in the same manner as if the titanium nitride had not been removed (i.e. titanium can be deposited over the entire circuit using the process described above and the circuit then heated to form a silicide in the source/drain region). Since titanium will also be overlying the silicide composite material 24, it will further react to increase the thickness of this material in the gate region which will have the desirable effect of decreasing gate electrode resistivity.

Figure 7:
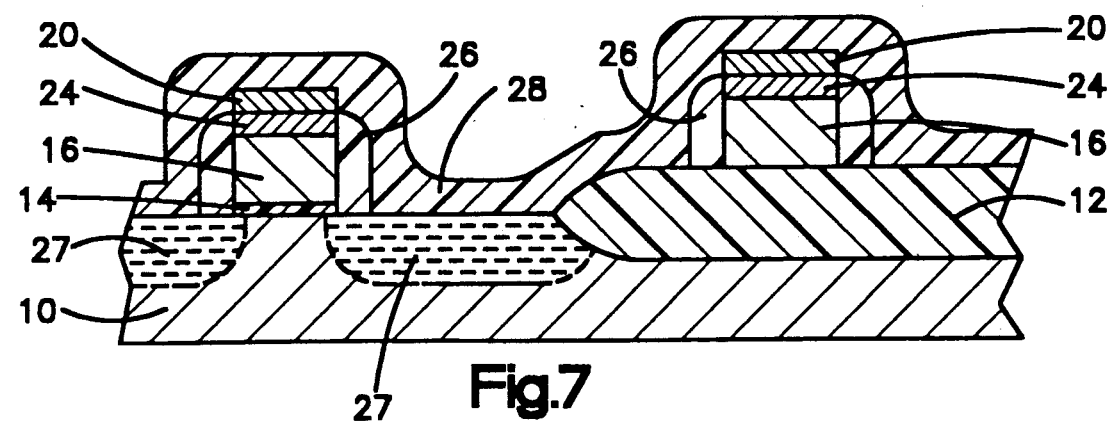
Figure 7A:
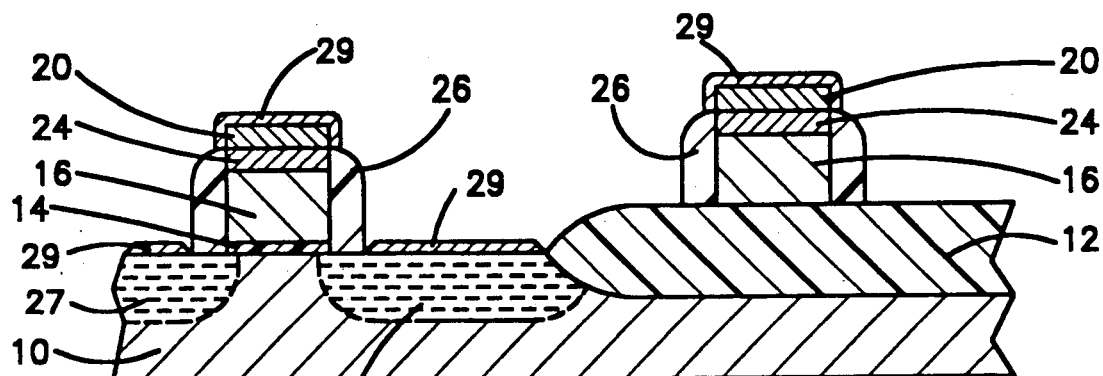
FIG. 7a depicts the first step of another embodiment of forming the refractory metal silicide at the source/drain regions.

In another embodiment of the invention, tungsten or other refractory metal is selectively applied to the structure following the step which resulted in FIG. 6. This selective deposition is shown as a tungsten layer 29 on both the source drain/region 27 and on the titanium nitride layer 20 in FIG. 7a. A process for selectively depositing the tungsten only on electrically conducting materials is accomplished in a cold wall reactor through the reduction of tungsten hexafluoride gas by hydrogen gas. Conventionally the process is performed at 250° C. –600° C. with 100–250 sccm of the tungsten hexafluoride, and 3–5 slpm of hydrogen at about 400 mT. This process is described in U.S. Pat. No. 4,746,621. Alternatively the titanium nitride layer 20 can be removed before selective deposition of the tungsten, in which case the tungsten is deposited on the silicide layer 24 as well as on the source/drain region 27.

Following the selective deposition, the tungsten is reacted with the silicon in the source/drain region 27 to form a refractory metal silicide by heating to about 675° C. If the tungsten 29 is deposited onto the titanium nitride it will remain thereon unreacted. If the tungsten 29 is deposited onto the silicide 24 it will react therewith to form a complex silicide. The resulting structure is similar to that shown in FIG. 9 except as explained above and that the refractory metal silicide 30 is tungsten silicide rather than titanium silicide.

While several embodiments of this invention have been shown and described, various adaptations can be made without departing from the scope of the invention as defined in the appended claims.

What is claimed is:

1. A process for forming an integrated circuit having refractory metal silicide layers at two spaced regions of a silicon substrate used to for an integrated circuit comprising the steps of:
    forming a layer of dielectric material on said silicon substrate;
    forming a layer of polysilicon on said layer of dielectric material;
    forming a layer of refractory metal on said polysilicon;
    forming a layer of essentially non-reflecting material on said layer of refractory metal;
    patterning said layers of polysilicon, said refractory metal and said non-reflecting material;
    said patterned layer including exposed side walls of said polysilicon;
    heating said integrated circuit to react the refractory metal with the patterned layer of polysilicon to form a refractory metal silicide at those locations whereat said refractory metal and said polysilicon are in contact;
    said heating being performed after the formation of said layer of non-reflecting material;
    subsequently forming a layer of dielectric material on the exposed side walls of said polysilicon;
    removing a portion of said dielectric material overlying said substrate to expose a portion of the silicon substrate surface while maintaining said dielectric material on the side walls of the polysilicon;
    forming a refractory metal silicide on the portion of the exposed silicon substrate whereat said dielectric material was removed.

2. The process as defined in claim 1 wherein the dielectric material formed on the substrate and on the exposed side walls of the polysilicon is silicon dioxide.

3. The process as defined in claim 2 wherein said refractory metal silicide on said substrate is formed from a second layer of refractory metal deposited over at least said substrate portion whereat said silicon dioxide was removed.

4. The process as defined in claim 3 wherein any unreacted refractory metal is removed after the step of 5. The process as defined in claim 4 wherein a silicide layer on the substrate is formed by first removing the non-reflecting material from the underlying silicide layers and depositing a layer of refractory metal over both the substrate and the formed silicide layers.

6. The process as defined in claim 5 wherein the material used for forming the silicide layer in the substrate is titanium.

7. The process as described in claim 2 further characterized by said non-reflecting material being titanium nitride.

8. The process as defined in claim 7 wherein the silicide layer formed on the substrate is formed by depositing a layer of refractory metal over the substrate and over the titanium nitride.

9. The process as described in claim 2 wherein at least one of the refractory metals deposited to form a silicide is titanium.

10. The process as described in claim 9 wherein both of the refractory metals deposited are titanium.

11. The process as defined in claim 2 wherein the refractory metal silicide which is formed on the exposed portion of the silicon substrate is formed by selective deposition of a refractory metal on exposed conducting materials including the exposed portion of the substrate.

12. The process as defined in claim 11 wherein said refractory metal which is selectively deposited on the exposed conducting materials is tungsten.

13. The process as defined in claim 2 wherein at least one recessed oxide region is formed on said substrate, and wherein a portion of at least one patterned layer of polysilicon is disposed on said recessed oxide.

14. A process for forming an integrated circuit having refractory metal silicide layers at two spaced regions of a silicon substrate one of which regions is a gate electrode and the other a source/drain region comprising the steps of:

forming a layer of dielectric material on said silicon substrate;

forming a layer of polysilicon on said layer of dielectric material;

forming a layer of refractory metal on said polysilicon;

forming a layer of essentially non-reflecting material on said layer of refractory metal;

patterning said layers of polysilicon, said refractory metal and said non-reflecting material;

said patterned layer including a gate electrode of said polysilicon having exposed side walls;

heating said integrated circuit to react the refractory metal with the gate electrode of the patterned layer of polysilicon to form a refractory metal silicide at those locations whereat said refractory metal and said polysilicon are in contact;

said heating step being performed after the formation of said layer of non-reflecting material;

subsequently forming a layer of dielectric material on the exposed side walls of said polysilicon gate electrode;

removing a portion of said dielectric material overlying said substrate to expose a portion of the silicon substrate surface as a source/drain region while maintaining said dielectric material on the side walls of the polysilicon gate electrode;

forming a refractory metal silicide on the source/drain region of the exposed silicon substrate whereat said dielectric material was removed.

15. The process as defined in claim 14 wherein the dielectric material formed on the substrate and on the side walls of the gate electrode is silicon dioxide.

16. The process as defined in claim 15 wherein the refractory metal silicide is formed in the source/drain region by coating the substrate with the refractory metal, and heating the substrate to form a silicide in the source/drain region.

17. The process as defined in claim 16 wherein any unreacted refractory metal is removed after forming the source/drain silicide to thereby prevent shorting between the gate electrode and the source/drain region.

18. The process as described in claim 17 wherein both of the refractory metals deposited are titanium.

19. The process as defined in claim 17 wherein the material used for forming the silicide layer in the source/drain region is titanium.

20. The process as defined in claim 19 wherein the non-reflecting material is titanium nitride, and the silicide layer formed in the source/drain region is formed by depositing a layer of titanium over the substrate and over the titanium nitride and reacting the titanium with contacting silicon and titanium nitride.

21. The process as defined in claim 17 wherein a silicide layer in the source/drain region is formed by first removing the non-reflecting material from the underlying silicide layers and depositing a refractory metal over both the source/drain region and the formed silicide layers.

22. The process as defined in claim 15 wherein at least one recessed oxide region is formed on said substrate, and wherein a portion of the polysilicon forming the gate electrode is disposed on said recessed oxide.

23. The process as defined in claim 15 wherein the refractory metal silicide which is formed on the exposed portion of the silicon substrate is formed by selective deposition of a refractory metal on exposed conducting materials including the exposed portion of the substrate.

24. The process as defined in claim 23 wherein said refractory metal which is selectively deposited on the exposed conducting materials is tungsten.

* * * * *